United States Patent
Takeuchi et al.

(10) Patent No.: US 6,426,535 B1
(45) Date of Patent: *Jul. 30, 2002

(54) SEMICONDUCTOR DEVICE HAVING IMPROVED SHORT CHANNEL RESISTANCE

(75) Inventors: Kiyoshi Takeuchi; Shigetaka Kumashiro, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/411,942

(22) Filed: Oct. 4, 1999

(30) Foreign Application Priority Data

Oct. 2, 1998 (JP) ............................................. 10-281037

(51) Int. Cl.[7] .............................................. H01L 29/76
(52) U.S. Cl. ...................... 257/408; 257/336; 257/344; 257/345; 257/409; 257/549; 257/550
(58) Field of Search ................................. 257/408, 336, 257/344, 549, 550, 345, 409

(56) References Cited

U.S. PATENT DOCUMENTS

| | | | | |
|---|---|---|---|---|
| 5,536,959 A | * | 7/1996 | Kellam ........................ 257/327 |
| 6,064,077 A | * | 5/2000 | Sandaresan ................... 257/23 |
| 6,100,561 A | * | 8/2000 | Wang et al. .................. 257/344 |
| 6,107,129 A | * | 8/2000 | Gardner et al. ............. 438/230 |
| 6,121,666 A | * | 9/2000 | Burr ............................ 257/408 |
| 6,144,068 A | * | 11/2000 | Kao et al. .................... 257/335 |
| 6,184,566 B1 | * | 2/2001 | Gardner et al. ............. 257/510 |
| 6,198,142 B1 | * | 3/2001 | Chau et al. ................... 257/408 |
| 6,204,543 B1 | * | 3/2001 | Komuro ....................... 257/408 |
| 6,215,156 B1 | * | 4/2001 | Yang ........................... 257/360 |

FOREIGN PATENT DOCUMENTS

| | | |
|---|---|---|
| JP | 62-245671 | 10/1987 |
| JP | 3-20045 | 1/1991 |
| JP | 6-244196 | 9/1994 |
| JP | 8-330587 | 12/1996 |
| JP | 9-181307 | 7/1997 |
| JP | 9-312397 | 12/1997 |

OTHER PUBLICATIONS

Sadana, D.K., et al., "Enhanced Short–Channel Effects in NMOSFET Due to Boron Redistribution Induced by Arsenic Source and Drain Implant", *1992 IEEE*, pp. 33.6.1–33.6.4.

* cited by examiner

Primary Examiner—Jerome Jackson, Jr.
Assistant Examiner—Edgardo Ortiz
(74) Attorney, Agent, or Firm—Hutchins, Wheeler & Dittmar

(57) ABSTRACT

First, first conductivity type impurities are injected into a semiconductor substrate to selectively form a first conductivity type region. Next, second conductivity type impurities higher in concentration than that of the first conductivity type impurities are injected into a predetermined region in the first conductivity type region to selectively form a second conductivity type region. Then, first conductivity type impurities are selectively injected into the second conductivity type region to selectively form a lightly doped second conductivity type region. By the step, a concentration distribution is formed in which a concentration of first conductivity type impurities increases from the first conductivity type region toward the lightly doped second conductivity type region.

8 Claims, 4 Drawing Sheets

SEMICONDUCTOR DEVICE HAVING IMPROVED SHORT CHANNEL RESISTANCE

BACKGROUND OF THE INVENTION

1. Field of the Invention

The present invention relates to a semiconductor device suited for small-sized elements and a manufacturing method of the same. The present invention relates to, in particular, a semiconductor device capable of preventing impurity concentration from varying in the neighborhood of a pn junction surface and a manufacturing method of the same.

2. Description of the Related Art

It is conventionally necessary to form a pn junction for most of semiconductor devices. In case of an n-channel MIS field effect transistor (metal insulator semiconductor field effect transistor), for example, an n-type source region and an n-type drain region are formed at the surface of a p-type semiconductor substrate. Thus, the pn junctions are formed between the substrate, and the source region and the drain region, respectively. In case of an npn-type bipolar transistor, an n-type emitter region is formed to come in contact with a p-type base region, the p-type base region is formed to come in contact with an n-type collector region. Thus, the pn junctions are formed between the emitter region and the base region and between the base region and the collector region, respectively.

In a semiconductor device having such pn junctions, if the impurity concentration of an n-type region is set higher than that of a p-type region, a pn junction is normally formed by the following method. First, p-type impurities (boron, indium or the like) are injected into a predetermined region of a substrate. N-type impurities (arsenic, phosphorous, antimony or the like) having a concentration higher than that of the p-type impurities are injected only into a region to form an n-type region by means of ion implantation or thermal diffusion. If n-type impurities are injected by means of ion implantation, heat treatment is conducted to activate the impurities. As a result, a pn junction in which the impurity concentration of the n-type region is higher than that of the p-type region, can be formed.

In case of forming an n-channel MIS type FET, in particular, a pn junction is normally formed by the following method. First, p-type impurities are injected into a semiconductor substrate. A gate insulating film is formed on the surface of the semiconductor substrate and a gate electrode is formed on the gate insulating film. Using the gate electrode as a mask, n-type impurities are injected into the surface of the semiconductor substrate by ion implantation. Thereafter, to activate the impurities, heat treatment is conducted. As a result, an n-type source region and an n-type drain region are formed in the region in which the n-type impurities are injected. Obviously, in either case, it is necessary to conduct heat treatment after injecting impurities so as to thermally diffuse or activate the impurities.

If a pn junction is formed by the above-stated method, however, or if a pn junction ($n^+$/p junction) consisting of a p-type region into which boron as p-type impurities is injected and an n-type region having a higher impurity concentration than that of the p-type region, in particular, the spatial distribution of boron is changed by heat treatment. This disadvantageously results in the deterioration of the characteristics of semiconductor elements. This phenomenon does not cause a serious problem to a conventional large-sized semiconductor element. As for recent small-sized semiconductor elements or an MIS-type FET, in particular, it is, however, well known that the variation of the spatial boron distribution has considerably adverse effect on semiconductor element characteristics (D. K. Sadana et al.,: "Enhanced Short Channel Effects in NMOSFETs due to Boron Redistribution Induced by Arsenic Source and Drain Implant", IEDM Technical Digest, IEEE, 1992, pp. 849–852).

That is to say, if a pn junction consisting of a p-type region into which boron is injected and an n-type region having a higher impurity concentration than that of the p-type region is formed, boron is absorbed into the $n^+$ region during heat treatment. Due to this, boron concentration is reduced in the vicinity of the boundary line of the $n^+$/p junction in the p-type region. If this phenomenon appears in an n-channel MIS-type FET, boron concentration between the source and drain regions is reduced. The reduction of boron concentration is more conspicuous if the distance between the source and drain regions, i.e., a channel length is shorter. Thus, a short channel effect, i.e., the phenomenon that the shorter the channel, the lower the threshold of the FET, is higher, making it difficult to form elements having very small (short channel) dimensions. This phenomenon is particularly serious if an MIS type FET having a channel length of 0.1 $\mu$m or less is formed.

Considering the above, there is proposed a method of manufacturing a field effect transistor to form a source region and a drain region by means of Halo injection or pocket injection (Japanese Patent Application Laid-Open Nos. Hei 6-244196, 8-330587 and 9-181307). FIGS. 1A and 1B are cross-sectional views showing the structure of a conventional semiconductor device.

As shown in FIGS. 1A and 1B, an element separation insulating film 26 is formed at the surface of a semiconductor substrate 21. Boron is injected into regions defined by the element separation insulating film 26 and a p-type element region is formed. Also, a gate insulating film 25 and a gate electrode 24 on the gate insulating film 25 are formed. First n-type regions 23a for putting a channel region below the gate electrode 24 between themselves are formed at the surface of the element region.

Furthermore, a boron injection region 22a or 22b into which boron ions are implanted is formed at a channel region side contacting with the n-type region 23a in the element region. A sidewall insulating film 27 is formed on the sidewall of the gate electrode 24. N-type impurity ions are implanted into regions which are not covered with the sidewall insulating film 27 and the second n-type region 23b deeper than the n-type region 23a is formed. Thus, a source-drain region 23 consisting of the n-type regions 23a and 23b is formed.

In the conventional semiconductor device constituted as stated above, the boron injection region 22a or 22b is formed by ion implantation so as to protrude the region toward the channel region side of the n-type region 23a and 23b. The boron injection region 22a or 22b is formed by, for example, oblique ion implantation for implanting ions into the element region from the oblique direction with respect to a direction perpendicular to the surface of the substrate 21.

FIG. 2 is a graph showing the distribution of impurity concentration at the surface of the semiconductor substrate shown in FIG. 1A, while the vertical axis indicates impurity concentration and the horizontal axis indicates the position of the semiconductor substrate. In FIG. 2, a broken line 36 indicates the concentration of p-type impurities injected into the surface of the semiconductor substrate 21, a dashed line 34 indicates the concentration of n-type impurities at the surface of the semiconductor substrate 21. A solid line 35 indicates the concentration of p-type impurities at the surface of the semiconductor substrate 21 after heat treatment.

As shown in FIG. 1A, in the conventional semiconductor device, the boron injection region 22a is formed so as to protrude the region 22a toward the channel region side of the n-type region 23a or 23b. Therefore, the neighborhood of the boundary line of the $n^+$/p junction in the p-type region has a higher boron concentration than the remaining portions in the p-type region. Owing to this, boron isabsorbed into the highly doped $n^+$ region by heat treatment and boron concentration of the neighborhood of the boundary line of the $n^+$/p junction in the p-type region is reduced. Further, boron concentration is increased in the neighborhood of the boundary line of the $n^+$/p junction in the $n^+$ region. Even if a lower concentration portion 32 and a higher concentration portion 33 are formed, it is possible to prevent the occurrence of a short channel effect to the transistor. Namely, in the conventional semiconductor device shown in FIGS. 1A and 1B, the boron injection regions 22a and 22b are formed to correct concentration distribution by the addition of concentrations.

Meanwhile, as shown in FIGS. 1A and 1B, to offset the lowered concentration of the lower concentration portion 32 by making boron concentration high in the neighborhood of the boundary line of the $n^+$/p junction in the p-type region in advance, it is necessary to protrude the boron injection region 22a or 22b toward the channel region side of the n-type region 23a or 23b by about several tens of nanometers in width with high accuracy.

The thickness and width of the boron injection regions 22a and 22b are, however, difficult to control independently. According to the oblique ion implantation susceptible to the shape of the sidewall of the gate electrode 24, it is difficult to protrude the boron injection regions 22a and 22b by about several tens of nanometers in width with high accuracy. In addition, since boron in the p-type region is diffused faster than in the $n^+$ region, boron that is injected to protrude toward the p-type region is easily absorbed into the $n^+$ region or diffused into the p-type region during heat treatment.

As can be understood from the above, in the conventional semiconductor device shown in FIGS. 1A and 1B, the lowered concentration of the lower concentration portion 12 cannot be strictly offset even with the boron injection regions 22a and 22b formed to protrude toward the p-type region. As a result, the irregular distribution of boron concentration occurs as indicated by the solid line 35 in FIG. 2. Further, even if the method of forming the boron injection regions 22a and 22b is employed, it is not possible to suppress the formation of the higher concentration portion 33 in the n-type region. This means that the boron ion implanted region cannot be controlled with high accuracy even with the conventional method of simply adding impurity concentrations. Besides, since boron diffusion is difficult to control, it is not possible to sufficiently suppress the occurrence of a short channel effect.

SUMMARY OF THE INVENTION

It is, therefore, an object of the present invention to provide a semiconductor device and a manufacturing method of the same capable of preventing impurity concentration from varying in the neighborhood of a pn junction plane, preventing a threshold from lowering by a short channel effect and obtaining good element characteristics.

According to one aspect of the present invention, a semiconductor device may comprise a first conductivity type region, a second conductivity type region formed to contact with the first conductivity type region, and a lightly doped second conductivity type region formed in the second conductivity type region and having a lower net impurity concentration than that of the second conductivity type region. A concentration distribution is formed in which a concentration of first conductivity type impurities increases from the first conductivity type region toward the lightly doped second conductivity type.

According to another aspect of the present invention, a semiconductor device may comprise a first conductivity type region, a gate insulating film selectively formed on the first conductivity type region, a gate electrode formed on the gate insulating film, and a channel region formed below the gate electrode at a surface of the first conductivity type region. The semiconductor device may further comprise second conductivity type source-drain regions formed in regions putting the channel region between themselves, and lightly doped source-drain regions formed in the second conductivity type source-drain regions, respectively, and having a lower net impurity concentration than that of the second conductivity type source-drain regions. Concentration distributions are formed in which a concentration of first conductivity type impurities increases from the first conductivity type region toward the lightly doped source-drain regions.

It should be noted that "a net impurity concentration" means an impurity concentration obtained by subtracting a concentration of the first conductivity type impurity from that of the second conductivity type impurity in the region.

The first conductivity type region may be formed at a surface of a semiconductor substrate.

According to another aspect of the present invention, a semiconductor device manufacturing method may comprise the steps of injecting first conductivity type impurities into a semiconductor substrate to selectively form a first conductivity type region, injecting second conductivity type impurities into a predetermined region in the first conductivity type region, the second conductivity type impurities being higher in concentration than that of the first conductivity type impurity to selectively form a second conductivity type region, and selectively injecting first conductivity type impurities into the second conductivity type region to selectively form a lightly doped second conductivity type region. By the step, a concentration distribution is formed in which a concentration of first conductivity type impurities increases from the first conductivity type region toward the lightly doped second conductivity type region.

According to another aspect of the present invention, a semiconductor device manufacturing method may comprise the steps of injecting first conductivity type impurities into a semiconductor substrate to selectively form a first conductivity type region, injecting first conductivity type impurities into a predetermined region in the first conductivity region to form a highly doped first conductivity type region having a higher impurity concentration than that of the first conductivity type region, and injecting second conductivity type impurities into a region surrounding the highly doped first conductivity type region to change the highly doped first conductivity type region to a lightly doped second conductivity type region and to form a second conductivity type region surrounding the lightly doped second conductivity type region. By the step, a concentration distribution is formed in which a concentration of first conductivity type impurities increases from the first conductivity type region toward the lightly doped second conductivity type region.

The manufacturing method may comprise a step of forming a gate electrode on the first conductivity type region after the step of forming the first conductivity type region. The second conductivity type region may be obtained by injecting second conductivity type impurities by ion implantation while the gate electrode is used as a mask.

The lightly doped second conductivity type region may be obtained by injecting first or second conductivity type impurities by ion implantation while using the gate electrode as a mask.

Moreover, the first conductivity type impurities are, for example, boron impurities.

In the conventional semiconductor device, a second conductivity type region is formed by injecting second conductivity type impurities higher in concentration than first conductivity type impurities into a predetermined region in the first conductivity type region, into which the first conductivity type impurities has been injected. After forming a pn junction by such a method, if heat treatment or the like, for example, is conducted, the first conductivity type impurities are absorbed into the second conductivity type region side in the vicinity of the interface of the first conductivity type region with the second conductivity type region, i.e., in the vicinity of the pn junction part. As a result, the concentration of the first conductivity type impurities decreases. If the concentration of the first conductivity type impurities decreases in the vicinity of the pn junction part in the first conductivity region, the deterioration of the characteristics of the semiconductor device, such as the decrease of a threshold voltage value due to a short channel effect, occurs.

According to the present invention, by contrast, the concentration distribution of the first conductivity type impurities is adjusted so that the concentration of the first conductivity type impurities increases from the first conductivity type region toward the lightly doped second conductivity type region. Therefore, even if the first conductivity type impurities are absorbed by the second conductivity type region side and the concentration of the first conductivity type impurities decreases in the vicinity of the pn junction part in the first conductivity type region, the first conductivity type impurities are diffused from the lightly doped second conductivity type region into the region, in which the impurity concentration is lowered. Thus, the flow of the first conductivity type impurities is offset and it is, therefore, possible to prevent the concentration of the first conductivity type impurities in the first conductivity type region from decreasing. As a result, if the present invention is applied to, for example, an MIS type FET, it is possible to suppress the occurrence of a short channel effect and to thereby obtain a semiconductor device having excellent characteristics.

Furthermore, according to the method of the present invention, compared with other methods of preventing the decrease of impurity concentration, in which the first conductivity type impurities are injected, in advance, into a region in which the concentration of the first conductivity type impurities is lowered, there is no to strictly control the range of forming the lightly doped second conductivity type region and the concentration distribution. Hence, it is possible to easily manufacture a semiconductor device having excellent characteristics.

DESCRIPTION OF THE PREFERRED EMBODIMENT

Figure 1A:
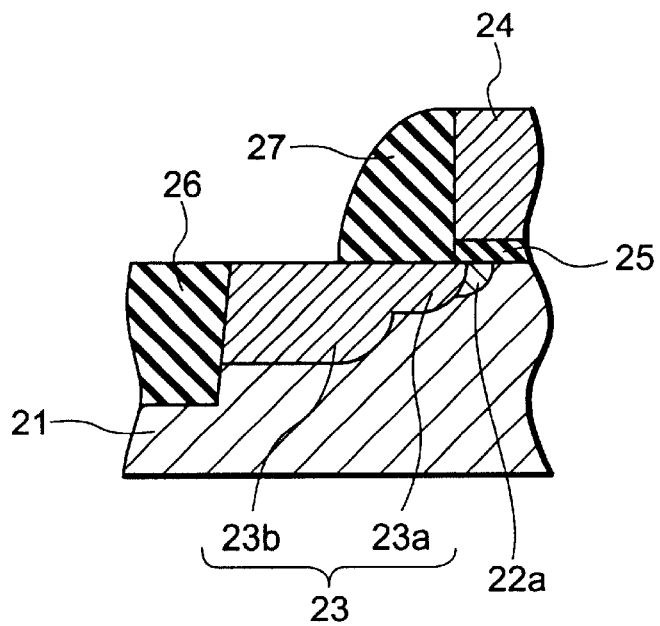
FIGS. 1A and 1B are cross-sectional views showing the structure of a conventional semiconductor device.
Figure 1B:
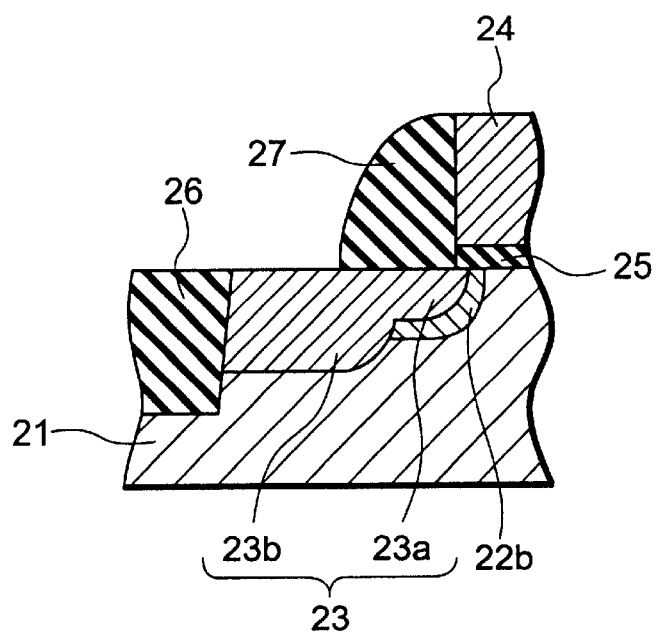
Figure 2:
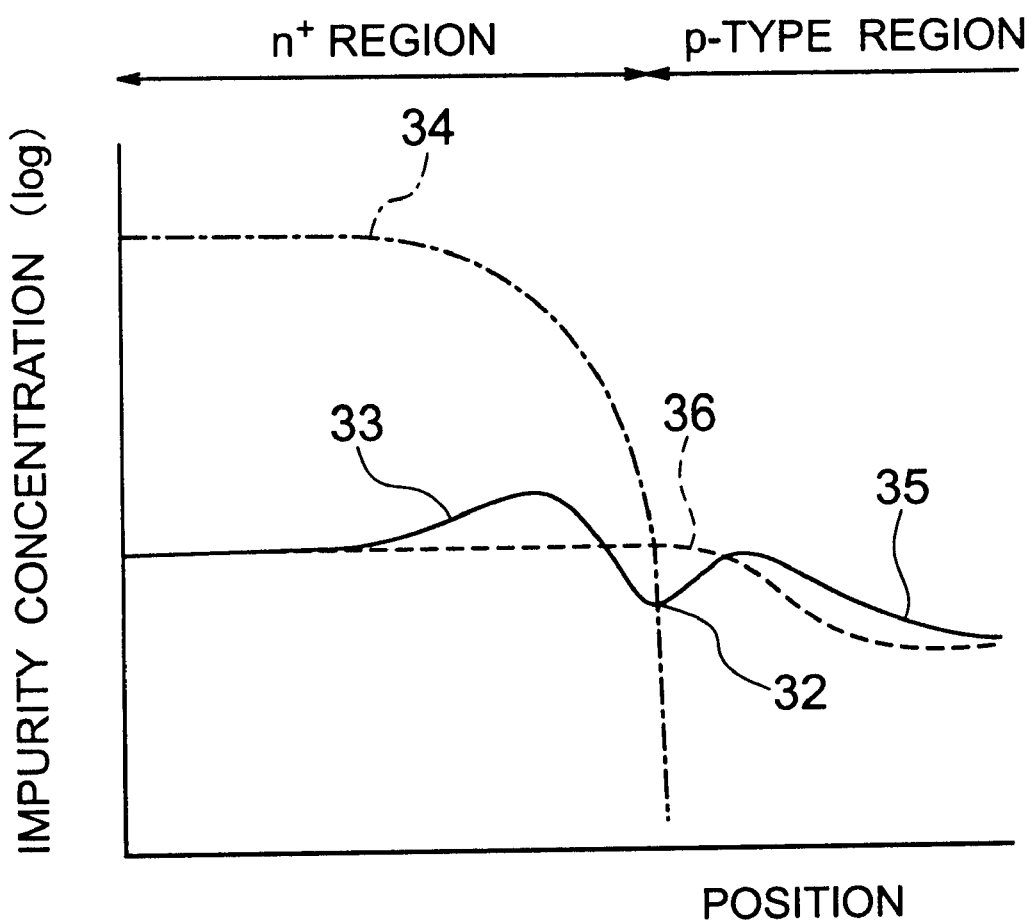
FIG. 2 is a graph showing the distribution of impurity concentration at the surface of a semiconductor substrate shown in FIG. 1A.
Figure 3A:
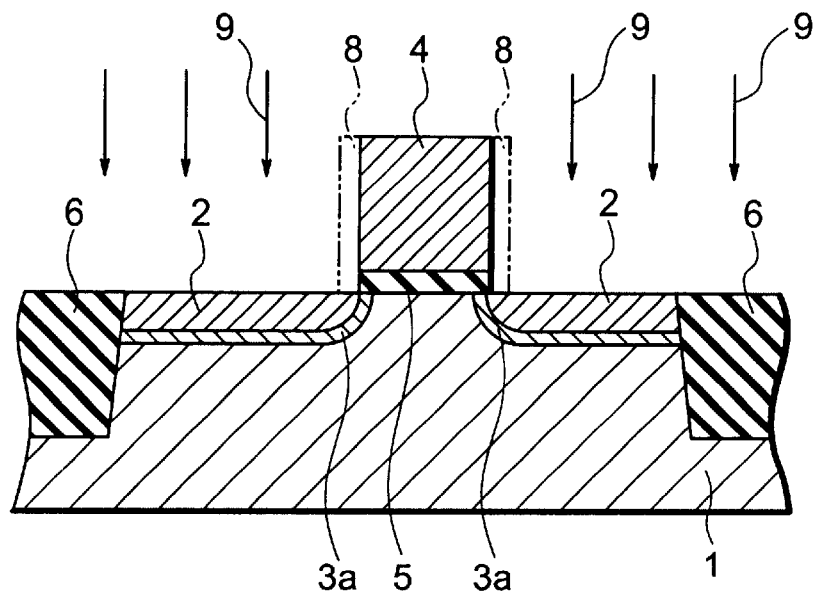
FIGS. 3A and 3B are cross-sectional views showing a semiconductor manufacturing method in one embodiment according to the present invention in the order of steps.
Figure 3B:
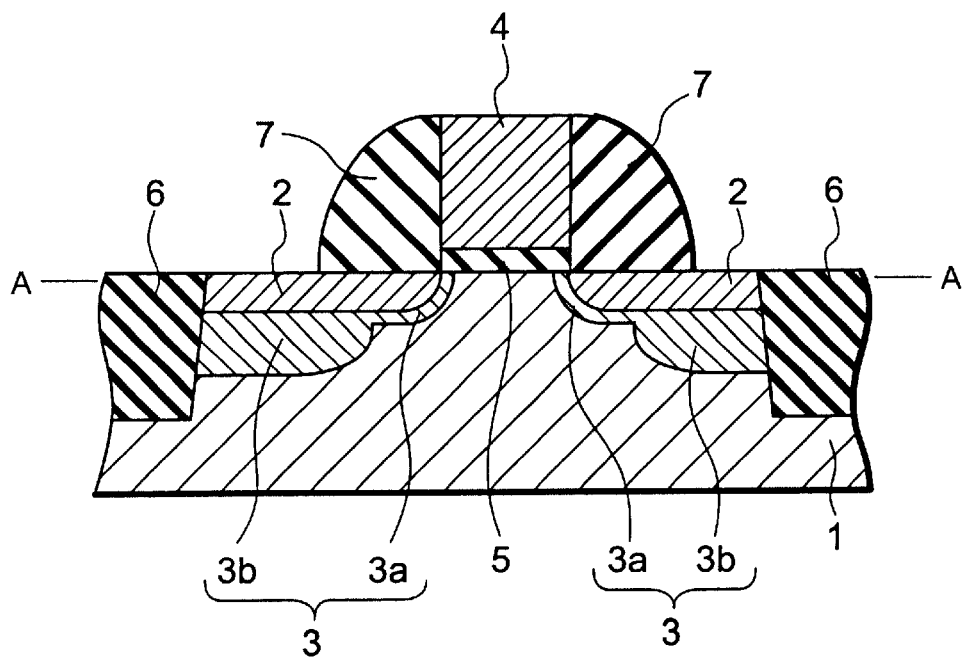

Hereinafter, a semiconductor device and a manufacturing method of the same in one embodiment according to the present invention will be specifically described with reference to the accompanying drawings. FIGS. 3A and 3B are cross-sectional views showing the manufacturing method of a semiconductor device in one embodiment according to the present invention in the order of steps. It is noted that this embodiment concerns the manufacturing method of an n-channel MIS type FET.

As shown in FIG. 3A, first, an element separation insulating film 6 is formed on the surface of a semiconductor substrate 1 and an element region is defined. Next, boron is injected into the element region by means of ion implantation or the like and a p-type element region (first conductivity type region) is obtained. An insulating film and a conductive film are sequentially formed on the surface of the element region. They are etched into predetermined shapes to form a gate insulating film 5 and a gate electrode 4. Using the gate electrode 4 as a mask, n-type impurities 9 such as arsenic, phosphorous, antimony or the like are injected by ion implantation with a higher concentration than the impurity concentration in the p-type element region, thereby selectively forming the first n-type region (second conductivity type region) 3a at the surface of the element region.

Thereafter, boron is injected by ion implantation into the surface of the n-type region 3a and a boron injection region (lightly doped second conductivity type region) 2 is formed. The boron injection region 2 is formed to be surrounded by the n-type region 3a in the thickness direction of the substrate and if seen two-dimensionally. It is preferable that ions of a boron compound having a heavier molecular weight than that of a boron ion such as $BF_2^+$, $B_{10}H_{14}^+$ and the like are used as ion species during boron injection to form the boron injection region 2. This is because the boron injection region 2 is formed shallower than the n-type region 3a. It is also preferable that boron ions or boron compound ions to form the boron injection region 2 are implanted from the direction perpendicular to the surface of the substrate 1 so as to form the boron injection region 2 in a narrower range than that of the n-type region 3a.

To form the boron injection region 2 in a narrower range than that of the n-type region 3a, it is possible to use a method in which the n-type region 3a is formed and then a thin sidewall insulating film 8 is formed on the sidewall surface of the gate electrode 4 before ion implantation to form the boron injection region 2. Further, at the time of forming the n-type region 3a, ions may be implanted in the direction oblique to the direction perpendicular to the surface of the substrate 1 to thereby form an n-type region 3a far below the gate electrode 4. The n-type region 3a may be formed after forming the boron injection region 2. In the latter case, after a p-type element region (first conductivity type region) is formed, p-type impurities are injected into a predetermined region in this element region to thereby form a highly doped p-type region (highly doped first conductivity type region) having a higher impurity concentration than that of the element region. Thereafter, n-type impurities are injected into a region surrounding the boron injection region 2, whereby the highly doped p-type region can be made a lightly doped n-type region and an n-type region 3a surrounding the lightly doped n-type region can formed.

Then, as shown in FIG. 3B, a sidewall insulating film 7 is formed on the sidewall surface of the gate electrode 4. Using the gate electrode 4 and the sidewall insulating film 7 as a mask, n-type impurities such as arsenic, phosphorous or antimony are injected into the surface of element region by ion implantation. Thus, the second n-type region 3b deeper than the n-type region 3a is formed below the n-type region 3a extending from a region distant from and below the gate electrode 4 toward the element separation insulating film 6. As a result, source-drain regions 3 each including the n-type regions 3a and 3b are formed. As n-type impurities to form the n-type regions 3a and 3b, it is particularly desirable to use arsenic or antimony, which is difficult to diffuse.

In this embodiment, ion implantation conditions for forming the boron injection region 2 can be, for example, ion species of $BF_2^+$, injection energy of 1 to 15 keV and dosage of $5 \times 10^{12}$ to $5 \times 10^{13}$ cm$^{-2}$. Ion implantation conditions for forming the n-type region 3a can be, for example, ion species of $As^+$, injection energy of 1 to 15 keV and dosage of $1 \times 10^{14}$ to $2 \times 10^{15}$ cm$^{-2}$.

In the semiconductor device thus manufactured in this embodiment, the source-drain region 3 of LDD (Lightly Doped Drain) structure or extension structure is formed out of the first n-type region 3a and the second n-type region 3b formed deeper than the first n-type region 3a. The source-drain regions 3 are formed at the surface of p-type semiconductor substrate so as to put a channel region formed below the gate electrode between them. Therefore, electric conduction between the source region and the drain region between which the channel region is put, is controlled by voltage applied to the gate electrode 4.

Figure 4:
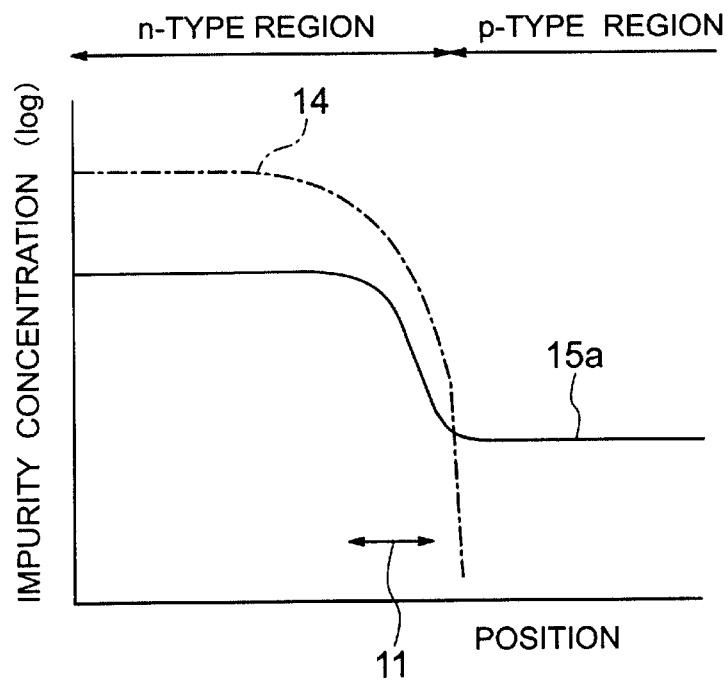
FIG. 4 is a graph showing the distribution of impurity concentration in a cross-section along a line A—A at the surface of a semiconductor substrate shown in FIG. 3A.
Figure 5:
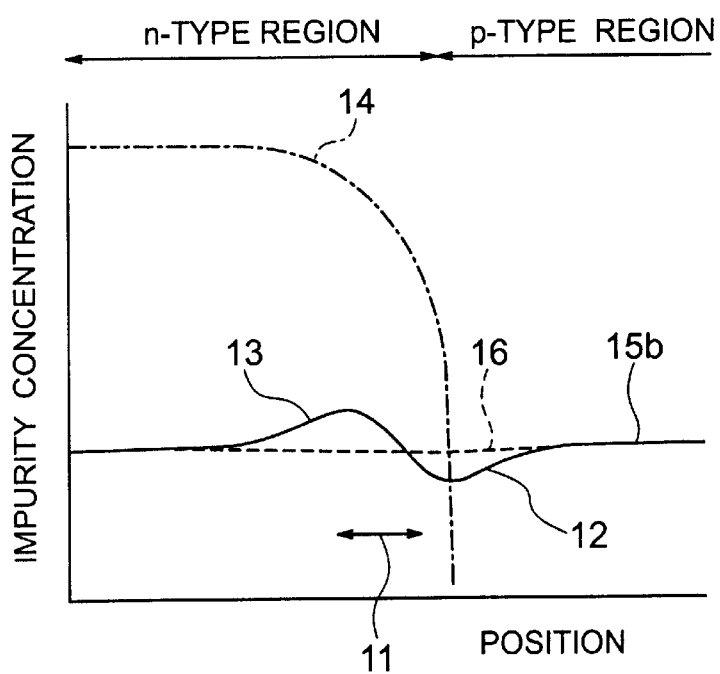
FIG. 5 is a graph showing the distribution of impurity concentration at the surface of the semiconductor substrate in which a boron injection region is not formed.

FIG. 4 is a graph showing the concentration distribution of impurities in a cross-section along line A—A at the surface of the semiconductor substrate shown in FIG. 3B, while the vertical axis indicates impurity concentration and the horizontal axis indicates the position of an element on the semiconductor substrate. FIG. 5 is a graph showing the concentration distribution of impurities at the surface of the semiconductor substrate in which no boron injection region 2 is formed, while the vertical axis indicates impurity concentration and the horizontal axis indicates the position of an element on the semiconductor substrate. It is noted that FIGS. 4 and 5 show impurity concentration distributions from one of the source-drain regions toward the channel region. A dashed line 14 indicates the concentration of the n-type impurities at the surface of the semiconductor substrate and solid lines 15a and 15b indicate the concentrations of p-type impurities there. Further, a broken line 16 shown in FIG. 5 indicates the concentration of p-type impurities at the surface of the semiconductor substrate before heat treatment. Next, description will be given to the functions and effects obtained by providing the boron injection region 2 with reference to FIGS. 4 and 5.

In this embodiment, the boron injection region 2 is formed within each source-drain region 3 including the n-type regions 3a and 3b and the boron injection region 2 also constitutes a part of the source-drain region 3. The boron concentration of the boron injection region 2 is set higher than the concentration of p-type impurities in the element region at the semiconductor substrate 1. Thus, a p-type concentration distribution in which the concentration of the p-type impurities increases from the element region toward the boron injection region 2. As shown in FIG. 4, therefore, p-type impurities (boron) are offset by the n-type impurities in the n-type regions 3a and 3b and to thereby form an electrically lightly doped n-type region. As can be seen from the above, the region having the n-type impurity concentration higher than the p-type impurity concentration is the source-drain region including the n-type regions 3a and 3b and the region having the p-type impurity concentration higher than the n-type impurity concentration is the p-type region at the semiconductor substrate 1.

As shown in FIG. 5, the boron concentration prior to heat treatment indicated by the broken line 16 is constant in the semiconductor device in which no boron injection region 2 is formed. The boron concentration after heat treatment indicated by the solid line 15b decreases in the vicinity of the interface between the p-type region and the n-type region to thereby form a lower concentration part 12. And the boron concentration increases in the vicinity of the interface between the n-type region and the p-type region within the n-type region to thereby form a higher concentration part 13.

The inventors of the present invention conducted research on a mechanism for the occurrence of the change of the boron concentration distribution. As a result, they discovered that an electric field is generated in a region 11 in the vicinity of the interface between the n-type region and the p-type region within the n-type region by the contact potential difference between the n-type region and the p-type region. Most of boron impurities introduced into the element region are negatively charged and the negatively charged boron ions are attracted by the electric field of the region 11 during heat treatment and moved to be distant from the channel region (in left direction in FIG. 5). The moved boron ions are more accumulated in the region distant from the channel region than in the region 11 and a higher concentration part 13 in which boron concentration is higher is formed in the n-type region. Meanwhile, boron impurities are taken out from the neighborhood of the interface between the n-type region and the p-type region to thereby form the lower concentration part 12. The decrease of the boron concentration in this channel region causes the short channel effect in the MIS type FET to increase.

In this embodiment, by contrast, the boron injection region 2 is formed in the source-drain region 3 including the n-type regions 3a and 3b and a p-type concentration distribution in which the p-type impurity concentration increases from the element region toward the boron injection region 2 is formed, as shown in FIG. 4. Therefore, the gradient of boron concentration is formed in the region 11, in which the electric field exists. In the semiconductor device in this embodiment, boron impurities existing in the interface between the n-type region and the p-type region flow in a direction in which the boron impurities are distant from the channel region by the electric field generated in the region 11.

At the same time, the gradient of boron concentration existing in the region 11 causes boron to diffuse toward the channel region. In this way, in this embodiment, the flow of boron to be distant from the channel region by the electric field and that of boron diffused toward the channel region by the concentration gradient of p-type impurities are offset by each other. As a result, the change of the boron concentration distribution before and after heat treatment can be suppressed, so that the lower boron concentration part 12 disappears in the p-type region and the higher boron concentration part 13 disappears in the n-type region. In this embodiment, therefore, the increase of the short channel effect can be suppressed by the boron injection region 2, which can be easily formed by conducting ion implantation in a self-aligned manner while using the gate electrode 4 as a mask, as in the case of forming the n-type region 3a. The decrease of the threshold value in the field effect transistor can be prevented as well.

As stated above, in this embodiment, the diffusion of boron in the boron injection region 2 outside the n-type region is employed to cancel the decrease of concentration at the lower concentration part 12. The diffusion of boron is slow in the n-type region and the electric field in the region 11 advantageously encloses boron within the n-type region. Owing to this, it is possible to automatically obtain a uniform boron concentration distribution, as shown in FIG. 4, without the need to accurately control the concentration distribution of boron injected to form the boron injection region 2. In this embodiment, it is possible to easily manufacture a semiconductor device having excellent performance.

In case of forming an n-channel MIS type FET having a channel length of about 0.05 to 0.1 μm, the boron concentration in the p-type region is preferably set to be between $3\times10^{17}$ to $3\times10^{18}$ cm$^{-3}$. In that case, according to the study while using a physical model simulating a diffusion phenomenon, the boron concentration in the boron injection region 2 is preferably set to be two to six times higher than that in the p-type region.

According to the present invention, it suffices if the boron injection region 2 is formed in the source-drain region 3. If the relative position between the source-drain region 3 and the boron injection region 2 satisfies the relationship shown in FIG. 3B, the same effect can be obtained even if the configuration of the source-drain region 3 is changed in the other portions. In the present invention, for example, the formation of the sidewall 7 and the second n-type region 3b formed deeper than the first n-type region 3a may be omitted to decrease the number of steps. In this embodiment shown in FIG. 3B, the boron injection region 2 is formed to be exposed to the surface of the semiconductor substrate. In this embodiment, however, the boron injection region 2 is not always formed to be exposed to the substrate surface. Additionally, a semiconductor substrate into which p-type impurities are injected may be used instead of forming the p-type element region at the surface of the semiconductor substrate 1.

The above-stated embodiment concerns a case of taking, as an example, an n-channel MIS type FET employing boron which exhibits most conspicuously the change of an impurity distribution as impurities injected into the substrate. If the present invention is applied to the MIS type FET as stated in the embodiment, it is possible to efficiently suppress the occurrence of a short channel effect. It is possible to easily form, in particular, a small-sized MIS type FET having a channel length of 0.1 μm or less which has been conventionally difficult to manufacture.

According to the present invention, impurities other than boron impurities can be used for the impurity redistribution generated by the same mechanism as that in case of using boron impurities. Furthermore, the present invention is applicable to a p-channel MIS type FET in which the conductivity type of impurities is reversed. In the latter case, the codes of voltage and charge in the above embodiment are reversed, boron impurities can be replaced by n-type impurities and n-type impurities can be replaced by p-type impurities. Further, the present invention is applicable to not only an MIS type FET but also all other semiconductor devices having pn junctions.

As stated above, according to the present invention, the first conductivity type impurities are selectively injected into the second conductivity type region formed within the first conductivity type region to thereby selectively form a lightly doped second conductivity type region. Therefore, the concentration distribution of the first conductivity type impurities in which the concentration of the first conductivity type impurities increases from the first conductivity type region toward the lightly doped second conductivity type region is obtained. Accordingly, it is possible to offset the decrease of the concentration of the first conductivity type impurities which occurs at the neighborhood of the interface between the first and second conductivity type regions in the first conductivity type region by the diffusion of the first conductivity type impurities from the lightly doped second conductivity type region. As a result, it is possible to prevent the concentration of the first conductivity type impurities in the first conductivity type region from decreasing and to thereby obtain a semiconductor device having excellent element characteristics.

What is claimed is:

1. A semiconductor device comprising:
   a first conductivity type region having a first conductivity type of impurities;
   a second conductivity type region formed to contact said first conductivity type region; and
   a lightly doped second conductivity type region formed in said second conductivity type region and having a lower net impurity concentration than that of said second conductivity type region, a concentration distribution being formed in which a concentration of said first conductivity type impurities increases from a first point within said first conductivity type region through said second conductivity type region to a second point within said lightly doped second conductivity type region.

2. A semiconductor device comprising:
   a first conductivity type region having a first conductivity type of impurities;
   a gate insulating film selectively formed on said first conductivity type region;
   a gate electrode formed oil said gate insulating film;
   a channel region formed below said gate electrode at a surface of said first conductivity type region;
   second conductivity type source-drain regions formed with said channel region disposed between themselves and extending outwardly from said gate electrode to form contact areas of said second conductivity type source-drain regions; and
   lightly doped source-drain regions of said second conductivity type formed in said contact areas of said second conductivity type source-drain regions, respectively, and having a lower net impurity concentration of said second conductivity type than that of said second conductivity type source-drain regions, concentration distributions being formed in which a concentration of said first conductivity type impurities increases from a first point within said first conductivity type region through said second conductivity type region to a second point within said lightly doped second conductivity type regions.

3. The semiconductor device according to claim 1, wherein said first conductivity type region is formed at a surface of a semiconductor substrate.

4. The semiconductor device according to claim 2, wherein said first conductivity type region is formed at a surface of a semiconductor substrate.

5. The semiconductor device according to claim 1, wherein said first conductivity type impurities are boron impurities.

6. The semiconductor device according to claim 2, wherein said first conductivity type impurities are boron impurities.

7. The semiconductor device according to claim 1, wherein said increasing concentration distribution of said first conductivity type of impurities of said first conductivity type region exists in said second conductivity type region, whereby said second conductivity type region contains a greater amount of said first conductivity type of impurities than said first conductivity type region.

8. The semiconductor device according to claim 2, wherein said increasing concentration distribution of said first conductivity type of impurities of said first conductivity type region exists in each of said second conductivity type source-drain regions, whereby said second conductivity type region contains a greater amount of said first conductivity type of impurities than said first conductivity type region.

* * * * *